(12) United States Patent
Rastogi et al.

(10) Patent No.: US 10,541,146 B2
(45) Date of Patent: *Jan. 21, 2020

(54) METHOD OF CYCLIC PLASMA ETCHING OF ORGANIC FILM USING SULFUR-BASED CHEMISTRY

(71) Applicant: Tokyo Electron Limited, Minato-ku, Tokyo (JP)

(72) Inventors: Vinayak Rastogi, Albany, NY (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/963,218

(22) Filed: Apr. 26, 2018

(65) Prior Publication Data

US 2018/0315615 A1 Nov. 1, 2018

Related U.S. Application Data

(60) Provisional application No. 62/490,504, filed on Apr. 26, 2017.

(51) Int. Cl.

| H01L 21/311 | (2006.01) |
| H01L 21/3065 | (2006.01) |
| H01L 21/3105 | (2006.01) |

(52) U.S. Cl.
CPC .... *H01L 21/31138* (2013.01); *H01L 21/3065* (2013.01); *H01L 21/31058* (2013.01); *H01L 21/31122* (2013.01); *H01L 21/31127* (2013.01); *H01J 2237/334* (2013.01)

(58) Field of Classification Search
CPC ......... H01L 21/31138; H01L 21/31058; H01L 21/31127; H01L 21/31122; H01L 21/3065; H01J 2237/334
See application file for complete search history.

(56) References Cited

U.S. PATENT DOCUMENTS

| 6,080,678 | A | * | 6/2000 | Yim | ..................... | H01L 21/0276 216/47 |
| 2005/0253272 | A1 | * | 11/2005 | Ohtake | .............. | H01L 21/31138 257/759 |
| 2009/0163028 | A1 | * | 6/2009 | Jung | ................... | H01L 21/0273 438/703 |
| 2010/0081094 | A1 | * | 4/2010 | Hasebe | .................. | C23C 16/02 430/323 |
| 2011/0266660 | A1 | * | 11/2011 | Kafuku | ................. | C23C 16/342 257/632 |
| 2017/0022612 | A1 | * | 1/2017 | Lei | ......................... | C23C 16/455 |

\* cited by examiner

*Primary Examiner* — Duy Vu N Deo
(74) *Attorney, Agent, or Firm* — Rothwell, Figg, Ernst & Manbeck, P.C.

(57) ABSTRACT

A method of etching is described. The method includes providing a substrate having a first material containing organic material and a second material that is different from the first material, forming a first chemical mixture by plasma-excitation of a first process gas containing an inert gas, and exposing the first material on the substrate to the first chemical mixture. Thereafter, the method includes forming a second chemical mixture by plasma-excitation of a second process gas containing S and O, and optionally a noble element, and exposing the first material on the substrate to the second plasma-excited process gas to selectively etch the first material relative to the second material.

20 Claims, 2 Drawing Sheets

METHOD OF CYCLIC PLASMA ETCHING OF ORGANIC FILM USING SULFUR-BASED CHEMISTRY

RELATED APPLICATIONS

This application claims priority to the following provisional application: U.S. Provisional Patent Application Ser. No. 62/490,504, filed Apr. 26, 2017, and entitled "METHOD OF CYCLIC PLASMA ETCHING OF ORGANIC FILM USING SULFUR-BASED CHEMISTRY", which is hereby incorporated by reference in its entirety.

FIELD OF INVENTION

The invention relates to a method for etching, and more particularly, a precision etch technique for etching a thin film for electronic device applications.

BACKGROUND OF THE INVENTION

The present invention relates to a method of manufacturing a semiconductor device such as an integrated circuit and transistors and transistor components for an integrated circuit. In the manufacture of a semiconductor device (especially on the microscopic scale), various fabrication processes are executed such as film-forming depositions, etch mask creation, patterning, material etching and removal, and doping treatments, are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other.

As device structures densify and develop vertically, the need for precision material etch becomes more compelling. Trade-offs between selectivity, profile, ARDE (aspect ratio dependent etching), and uniformity in plasma etch processes become difficult to manage. Current approaches to patterning and pattern transfer by balancing these trade-offs is not sustainable. The root cause for these trade-offs is the inability to control ion energy, ion flux, and radical flux independently. However, self-limiting processes, such as atomic layer etching (ALE), offer a viable route to escape these trade-offs by decoupling the etch process into sequential steps of surface modification and removal of modified surface regions, thereby allowing the segregation of the roles of radical flux and ion flux and energy.

SUMMARY

Techniques herein pertain to device fabrication using precision etch techniques.

A method of etching is described. The method includes providing a substrate having a first material containing organic material and a second material that is different from the first material, forming a first chemical mixture by plasma-excitation of a first process gas containing an inert gas, and exposing the first material on the substrate to the first chemical mixture. Thereafter, the method includes forming a second chemical mixture by plasma-excitation of a second process gas containing S and O, and optionally a noble element, and exposing the first material on the substrate to the second plasma-excited process gas to selectively etch the first material relative to the second material. In one embodiment, the second process gas can include COS. In another embodiment, the second process gas can include $SO_2$.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION

Techniques herein pertain to device fabrication using precision etch techniques. Several instances manifest in semiconductor manufacturing in both front end of line (FEOL, e.g., transistor fabrication) through to the back end of line (BEOL, e.g., interconnect fabrication), where oxide and nitride films (typically silicon-containing, in nature) need to be etched with a high degree of precision.

Numerous fabrication sequences in semiconductor manufacturing demand precision etch techniques for both 2D (two-dimensional) and 3D (three-dimensional) device structures. Still, trilayer etch masks (e.g., including photoresist, anti-reflective coatings (ARC), organic carbon films) serve as the workhorse of patterning masks into the underlying layer. Current challenges involve obtaining pattern transfer with no loading artifacts, vertical sidewall profile and square bottom with immense selectivity to the ARC layer. Continuous plasma etch process do not allow a solution to such challenges.

According to various embodiments, precision cyclic plasma etching techniques using chemistries including sulfur-based chemistry and carbon-based chemistry are described for etching organic carbon film. For sulfur-based chemistry, gaseous chemistries include S and O (e.g., COS/$O_2$/Ar gas mixtures, or $SO_2$/$O_2$/Ar gas mixtures) for etching organic carbon film using various layers as a mask, including silicon-containing ARC layers. For carbon-based chemistry, gaseous chemistries include C and O (e.g., $CO/O_2/Ar$ gas mixtures, or $CO_2/O_2/Ar$ gas mixtures) for etching organic carbon film using various layers as a mask, including silicon-containing ARC layers.

Figure 1:
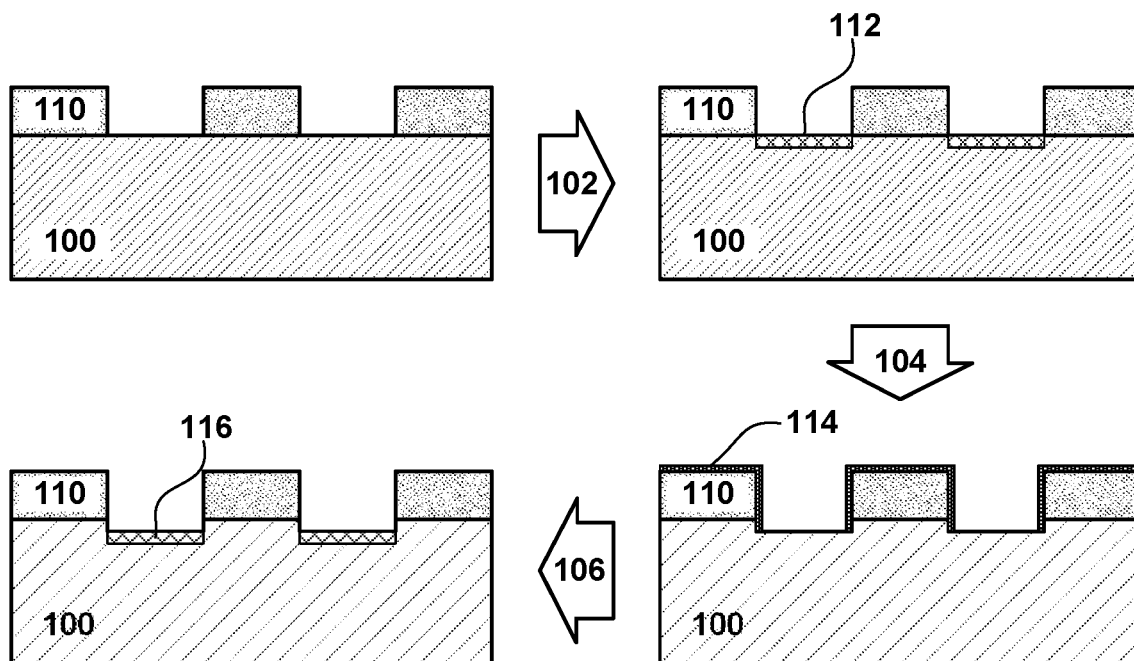
FIG. 1 illustrates a schematic representation of a method of etching a thin film on a substrate according to an embodiment.
Figure 2:
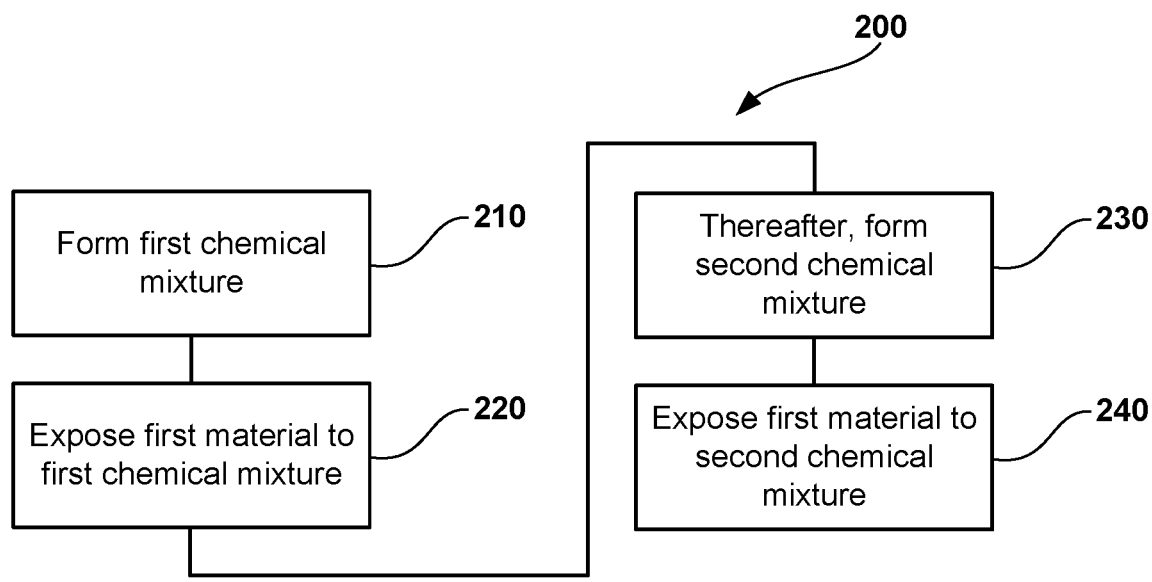
FIG. 2 provides a flow chart illustrating a method of etching a substrate according to an embodiment.

According to several embodiments, FIGS. 1 and 2 illustrate a method of etching a thin film. The method, depicted as flow chart 200, includes providing a substrate having a first material 100 containing an organic material and a second material 110 that is different from the first material 100, forming a first chemical mixture by plasma-excitation of a first process gas containing an inert gas in step 210, and exposing the first material on the substrate to the first chemical mixture in step 220, the combination of which is depicted as 102 in FIG. 1. During 102, the exposed surfaces of the first material 100 are modified to a finite depth to form a modified sub-layer 112 in the first material 100 during the exposing to the first chemical mixture. For example, the inventors surmise that carbon-carbon bonds can be broken during this phase of the etch cycle.

Thereafter, the method includes forming a second chemical mixture by plasma-excitation of a second process gas containing S and O, and optionally a noble element in step 230, and exposing the first material 100 on the substrate to the second plasma-excited process gas to selectively etch the first material 100 relative to the second material in step 240, the combination of which is depicted as 104 in FIG. 1. During 104, the modified sub-layer 112 in the first material is removed or etched during the exposing to the second chemical mixture. Also, during 104, a protection layer 114 is formed over the second material 110 during the exposing to the second chemical mixture. For example, the inventors surmise the modified carbon layer is removed during a desorption phase using O* radicals obtained via dissociation of $O_2$, and COS or $SO_2$ gas. The S* radicals can form a complex with C atoms on the sidewall surface of the second material 110 providing $C_xS_y$-containing protection layer to avoid sidewall consumption during the desorption phase. Additionally, the $C_xS_y$-containing protection layer can provide the ARC mask protection for extremely high selectivity. Alternatively, the method includes forming a second chemical mixture by plasma-excitation of a second process gas containing C and O, and optionally a noble element in step 230, and exposing the first material 100 on the substrate to the second plasma-excited process gas to selectively etch the first material 100 relative to the second material in step 240, the combination of which is depicted as 104 in FIG. 1.

Further yet, the method can include forming the first chemical mixture by plasma-excitation of a first process gas containing an inert gas, and exposing the first material on the substrate to the first chemical mixture, the combination of which is depicted as 106 in FIG. 1. During 106, the exposed surfaces of the first material 100 are modified to a finite depth to form another modified sub-layer 116 in the first material 100 during the exposing to the first chemical mixture.

The first material 100, to be etched, contains, consists essentially of, or consists of an organic material. The organic material can include a hard mask, a soft mask, or a planarization layer. The first material can include a carbon-containing mask, such as amorphous carbon. The first material may be deposited using vapor deposition processes or spin-on deposition processes.

The second material 110 can include a single layer, or multi-layer stack. The second material 110 may be patterned as shown in FIG. 1. The second material can include an inorganic material. The second material can include Si, Ge, or a metal (M), and optionally one or more elements selected from the group consisting of O, N, C, F, Cl, Br, and S. The second material can include silicon, silicon oxide, silicon nitride, silicon carbide, metal, metal oxide, metal nitride, metal carbide, or metal alloy, or combinations thereof. The second material can include a Si-containing anti-reflective coating (ARC) and silicon oxide (e.g., Si content can be less than 20%, or greater than 40%). The second material may be deposited using vapor deposition processes or spin-on deposition processes.

As set forth above, the first chemical mixture is formed from the plasma excitation of a first process gas. The first process gas contains an inert gas, such as a noble gas. In one embodiment, the first process gas includes Ar. In another embodiment, the first process gas consists essentially of or consists of Ar.

As also set forth above, the second chemical mixture is formed from the plasma excitation of a second process gas. The second process gas can contain sulfur (S) and oxygen (O), and can optionally include a noble element, such as Ar (argon). The second process gas can include additives, such as $CO$, $CO_2$, $O_2$, $H_2$, $N_2$, $C_xH_y$, $C_xR_z$, or $C_xH_yR_z$ (wherein x, y and z are integers greater than zero, and R is a halogen element). The second process gas can contain a compound having both S and O, such as COS, $SO_2$, or $SO_3$. In one embodiment, the second process gas includes $SO_2$, $O_2$, and Ar. In another embodiment, the second process gas consists essentially of or consists of $SO_2$, $O_2$, and Ar. Alternatively, in another embodiment, the second process gas includes COS, $O_2$, and Ar. In yet another embodiment, the second process gas consists essentially of or consists of COS, $O_2$, and Ar.

Alternatively, the second process gas can contain carbon (C) and oxygen (O), and can optionally include a noble element, such as Ar (argon). The second process gas can contain a compound having both C and O, such as CO or $CO_2$. The second process gas can include additives, such as COS, $SO_2$, $O_2$, $H_2$, $N_2$, $C_xH_y$, $C_xR_z$, or $C_xH_yR_z$ (wherein x, y and z are integers greater than zero, and R is a halogen element). For example, the second process gas can include CO, or $CO_2$, or both CO and $CO_2$. In one embodiment, the second process gas includes $CO_2$, $O_2$, and Ar. In another embodiment, the second process gas consists essentially of or consists of $CO_2$, $O_2$, and Ar. Alternatively, in another embodiment, the second process gas includes CO, $O_2$, and Ar. In yet another embodiment, the second process gas consists essentially of or consists of CO, $O_2$, and Ar.

Figure 3A:
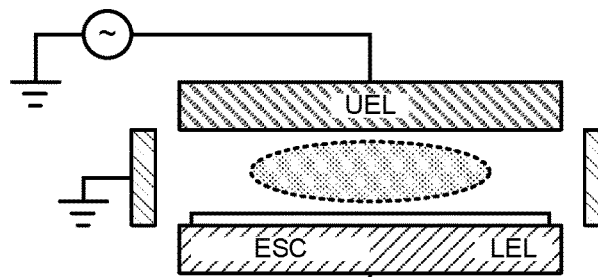
FIGS. 3A through 3D provide schematic illustrations of plasma processing systems for performing the method of etching according to various embodiments.

The plasma-excitation of the first process and/or the second process gas can be performed in-situ (i.e., the first and/or second chemical mixture is formed within a gas-phase, vacuum environment in proximate contact with the substrate), or ex-situ (i.e., the first and/or second chemical mixture is formed within a gas-phase, vacuum environment remotely located relative to the substrate). FIGS. 3A through 3D provide several plasma generating systems that may be used to facilitate plasma-excitation of a process gas. FIG. 3A illustrates a capacitively coupled plasma (CCP) system, wherein plasma is formed proximate a substrate between an upper plate electrode (UEL) and a lower plate electrode (LEL), the lower electrode also serving as an electrostatic chuck (ESC) to support and retain the substrate. Plasma is formed by coupling radio frequency (RF) power to at least one of the electrodes. As shown in FIG. 3A, RF power is coupled to both the upper and lower electrodes, and the power coupling may include differing RF frequencies. Alternatively, multiple RF power sources may be coupled to the same electrode. Moreover, direct current (DC) power may be coupled to the upper electrode.

Figure 3B:
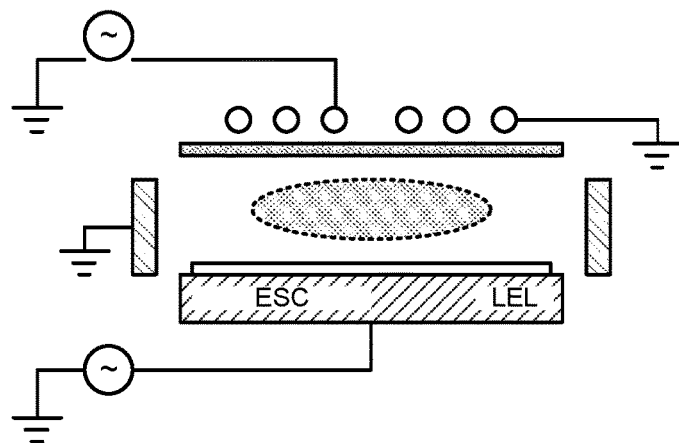

FIG. 3B illustrates an inductively coupled plasma (ICP) system, wherein plasma is formed proximate a substrate between an inductive element (e.g., a planar, or solenoidal/helical coil) and a lower plate electrode (LEL), the lower electrode also serving as an electrostatic chuck (ESC) to support and retain the substrate. Plasma is formed by coupling radio frequency (RF) power to the inductive coupling element. As shown in FIG. 3B, RF power is coupled to both the inductive element and lower electrode, and the power coupling may include differing RF frequencies.

Figure 3C:
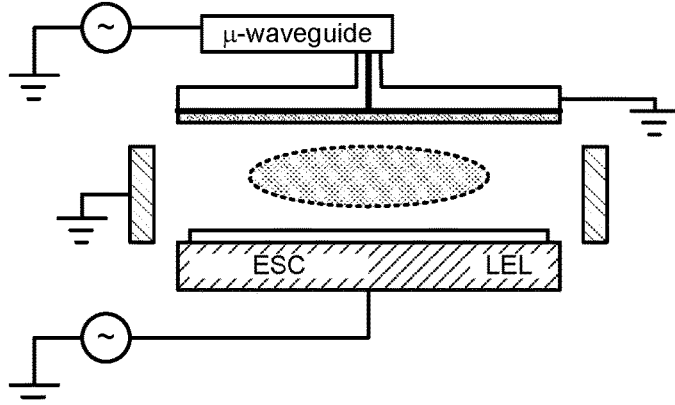

FIG. 3C illustrates a surface wave plasma (SWP) system, wherein plasma is formed proximate a substrate between a slotted plane antenna and a lower plate electrode (LEL), the lower electrode also serving as an electrostatic chuck (ESC) to support and retain the substrate. Plasma is formed by coupling radio frequency (RF) power at microwave frequencies through a waveguide and coaxial line to the slotted plane antenna. As shown in FIG. 3C, RF power is coupled to both the slotted plane antenna and lower electrode, and the power coupling may include differing RF frequencies.

Figure 3D:
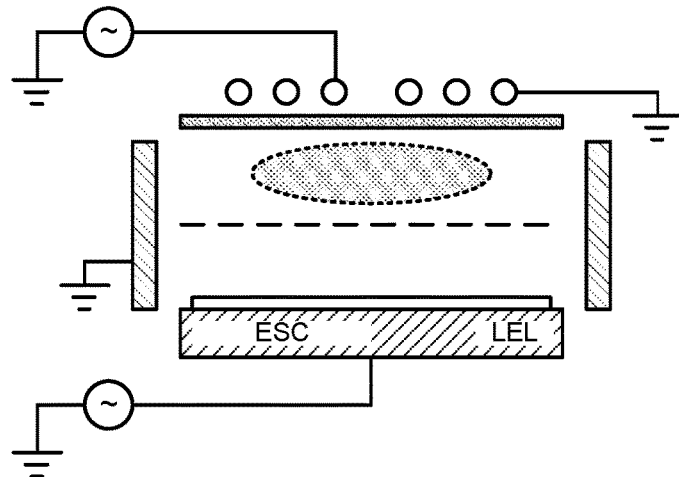

FIG. 3D illustrates remote plasma system, wherein plasma is formed in a region remote from a substrate and separated from the substrate by a filter arranged to impede the transport of charged particles from the remote plasma source to a processing region proximate the substrate. The substrate is supported by a lower plate electrode (LEL) that also serves as an electrostatic chuck (ESC) to retain the substrate. Plasma is formed by coupling radio frequency (RF) power to a plasma generating device adjacent the remotely located region. As shown in FIG. 9D, RF power is coupled to both the plasma generating device adjacent the remote region and lower electrode, and the power coupling may include differing RF frequencies.

The plasma processing systems of FIGS. 3A through 3D are intended to be illustrative of various techniques for implementing the stepped ion/radical process described. Other embodiments are contemplated including both combinations and variations of the systems described.

When forming the first chemical mixture by plasma-excitation of the first process gas containing aninert gas, such as a noble gas, and exposing the first material on the substrate to the first chemical mixture, the gas pressure for the exposing can be less than or equal to 1000 mTorr. For example, the gas pressure may range from 10 mTorr to 100 mTorr. Additionally, the substrate may be electrically biased by coupling RF power to the lower plate electrode (LEL). RF power may or may not also be applied to the plasma generating device.

When forming the second chemical mixture by plasma-excitation of the second process gas containing S and O, such as COS or $SO_2$, $O_2$, and optionally a noble gas, and exposing the second material on the substrate to the second chemical mixture, the gas pressure for the exposing can be less than or equal to 1000 mTorr. For example, the gas pressure may range from 10 mTorr to 100 mTorr. Additionally, the substrate may be electrically biased by coupling RF power to the lower plate electrode (LEL). RF power may or may not also be applied to the plasma generating device.

When forming the first chemical mixture by plasma-excitation of the first process gas containing a noble gas (e.g., Ar), and exposing the first material on the substrate to the first chemical mixture, and when forming the second chemical mixture by plasma-excitation of the second process gas containing S and O (e.g., COS or $SO_2$) the inventors have observed a cyclic plasma etch that results in (1) little to no lateral etch, (ii) little to no mask undercut, and (iii) little to no aspect ratio dependent etch (ARDE).

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:
1. A method of etching, comprising:
providing a substrate having a first material containing organic material and a second material that is different from the first material;
forming a first chemical mixture by plasma-excitation of a first process gas containing an inert gas;
exposing the first material on the substrate to the first chemical mixture to change a portion of the first material into a modified first material sub-layer;
thereafter, forming a second chemical mixture by plasma-excitation of a second process gas containing S and O, and optionally a noble element, wherein the second process gas is different from the first process gas; and
exposing the first material including the modified first material sub-layer to the second chemical mixture to selectively etch the modified first material sub-layer relative to the second material.

2. The method of claim 1, wherein the first process gas contains a noble element.

3. The method of claim 1, wherein the first process gas contains Ar.

4. The method of claim 1, wherein the second process gas includes a compound having both S and O.

5. The method of claim 1, wherein the second process gas contains COS or $SO_2$.

6. The method of claim 1, wherein the first material includes amorphous carbon.

7. The method of claim 1, wherein the first material includes a a hard mask, a soft mask, or a planarization layer.

8. The method of claim 1, wherein the second material includes an inorganic material.

9. The method of claim 1, wherein the second material includes Si, Ge, or a metal (M), and optionally one or more elements selected from the group consisting of O, N, C, F, Cl, Br, and S.

10. The method of claim 1, wherein the second material includes silicon, silicon oxide, silicon nitride, silicon carbide, metal, metal oxide, metal nitride, metal carbide, or metal alloy, or combinations thereof.

11. The method of claim 1, wherein the second material includes a Si-containing anti-reflective coating (ARC) and silicon oxide.

12. The method of claim 1, further comprising:
exposing the second material to the second chemical mixture; and
forming a protection layer over the second material during the exposing the second material to the second chemical mixture.

13. The method of claim 1, wherein the plasma excitation of the first process gas or the plasma excitation of the second process gas includes generating plasma using a capacitively coupled plasma source containing an upper plate electrode and a lower plate electrode supporting the substrate or using an inductively coupled plasma source containing an inductive element and a lower plate electrode supporting the substrate.

14. The method of claim 1, wherein the plasma excitation of the first process gas or the plasma excitation of the second process gas includes generating plasma using a remote plasma source.

15. The method of claim 1, further comprising:
repeating the steps of forming the first chemical mixture, exposing the first material to the first chemical mixture, forming the second chemical mixture, and exposing the first material to the second chemical mixture to incrementally remove additional portions of the first material.

16. The method of claim 1, wherein
the first material is an organic carbon layer,
the first material has a plurality of first areas including said portion of the first material and a plurality of second areas,
the second material is stacked on the plurality of second areas,
the exposing the first material to the first chemical mixture includes (i) exposing the plurality of first areas to the first chemical mixture and (ii) exposing the second material to the first chemical mixture, and
the exposing the plurality of first areas to the first chemical mixture forms a plurality of modified first material sub-layers as modified organic carbon sub-layers.

17. The method of claim 16, wherein
the exposing the first material to the second chemical mixture includes (i) exposing the modified organic carbon sub-layers to the second chemical mixture and (ii) exposing the second material to the second chemical mixture,
O radicals of the second chemical mixture etch the modified organic carbon sub-layers, and
S radicals of the second chemical mixture form a complex with C atoms on a surface of the second material and thereby a protection layer is formed on the surface of the second material.

18. A method of etching, comprising:
providing a substrate having a first material containing organic material and a second material that is different from the first material;
forming a first chemical mixture by plasma-excitation of a first process gas containing an inert gas;
exposing the first material on the substrate to the first chemical mixture;
thereafter, forming a second chemical mixture by plasma-excitation of a second process gas containing S and O, and optionally a noble element; and
exposing the first material on the substrate to the second plasma-excited process gas to selectively etch the first material relative to the second material,
wherein the first process gas consists of Ar.

19. A method of etching, comprising:
providing a substrate having a first material containing organic material and a second material that is different from the first material;
forming a first chemical mixture by plasma-excitation of a first process gas containing an inert gas;
exposing the first material on the substrate to the first chemical mixture;
thereafter, forming a second chemical mixture by plasma-excitation of a second process gas containing S and O, and optionally a noble element; and
exposing the first material on the substrate to the second plasma-excited process gas to selectively etch the first material relative to the second material,
wherein the second process gas consists of $O_2$, Ar, and a gas selected from the group consisting of $SO_2$ and COS.

20. A method of etching, comprising:
providing a substrate having a first material containing organic material and a second material that is different from the first material;
forming a first chemical mixture by plasma-excitation of a first process gas containing an inert gas;
exposing the first material on the substrate to the first chemical mixture;
modifying exposed surfaces of the first material to a finite depth to form a modified sub-layer in the first material during the exposing to the first chemical mixture;
thereafter, forming a second chemical mixture by plasma-excitation of a second process gas containing S and O, and optionally a noble element;
exposing the first material on the substrate to the second plasma-excited process gas to selectively etch the first material relative to the second material;
etching the modified sub-layer in the first material during the exposing to the second chemical mixture;
forming a protection layer over the second material during the exposing to the second chemical mixture; and
removing the protection layer over the second material during exposing to the first chemical mixture.

* * * * *